United States Patent
Lvovsky et al.

(10) Patent No.: US 9,575,149 B2
(45) Date of Patent: Feb. 21, 2017

(54) SYSTEM AND METHOD FOR COOLING A MAGNETIC RESONANCE IMAGING DEVICE

(71) Applicant: General Electric Company, Schenectady, NY (US)

(72) Inventors: Yuri Lvovsky, Florence, SC (US); Mark Derakhshan, Florence, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 218 days.

(21) Appl. No.: 14/581,164

(22) Filed: Dec. 23, 2014

(65) Prior Publication Data

US 2016/0178716 A1     Jun. 23, 2016

(51) Int. Cl.
G01R 33/38        (2006.01)
G01R 33/3815      (2006.01)
H01F 6/04         (2006.01)

(52) U.S. Cl.
CPC ............ G01R 33/3804 (2013.01); H01F 6/04 (2013.01); G01R 33/3815 (2013.01)

(58) Field of Classification Search
CPC ..... G01R 33/38; G01R 33/3815; G01R 33/00; G01R 33/20; H01F 6/04; H01F 6/02; H01F 6/06
USPC .... 62/3.1, 51.1; 505/162, 163; 324/162, 163
See application file for complete search history.

(56) References Cited

U.S. PATENT DOCUMENTS

| | | | |
|---|---|---|---|
| 5,724,820 A | 3/1998 | Iwasa | |
| 5,787,714 A | 8/1998 | Ohkura et al. | |
| 5,918,470 A * | 7/1999 | Xu | F25D 19/006 335/216 |
| 6,029,458 A * | 2/2000 | Eckels | G01R 33/3815 335/301 |
| 7,222,490 B2 * | 5/2007 | Triebe | F25D 19/006 62/51.1 |
| 7,370,481 B2 | 5/2008 | Kawamura et al. | |
| 7,559,205 B2 | 7/2009 | Atkins et al. | |
| 7,646,272 B1 * | 1/2010 | Schmierer | G01R 33/3802 335/216 |
| 7,764,153 B2 | 7/2010 | Isogami et al. | |
| 7,859,374 B2 | 12/2010 | Iwasa et al. | |
| 8,233,952 B2 | 7/2012 | Park et al. | |
| 8,315,679 B2 | 11/2012 | Husband et al. | |
| 2004/0066194 A1* | 4/2004 | Slade | G01R 33/3808 324/318 |

(Continued)

OTHER PUBLICATIONS

International Search Report and Written Opinion for International Application No. PCT/US2015/066009, mail date Apr. 11, 2016 13 pages.

*Primary Examiner* — Mohammad M Ali
(74) *Attorney, Agent, or Firm* — Grogan, Tuccillo & Vanderleeden, LLP

(57) ABSTRACT

A cooling system includes a first cooling loop containing a first cryogen, the first cooling loop being in thermal communication with a superconducting magnet and being configured to provide primary cooling for the magnet and a second cooling loop also containing the first cryogen. The second cooling loop is in thermal communication with an enclosure containing a second cryogen and is configured to cool the second cryogen within the enclosure. The enclosure is in thermal communication with the superconducting magnet and is configured to provide secondary cooling for the magnet.

25 Claims, 4 Drawing Sheets

(56) References Cited

U.S. PATENT DOCUMENTS

| | | | |
|---|---|---|---|
| 2006/0022779 A1* | 2/2006 | Jiang | H01F 6/04 335/216 |
| 2006/0097146 A1* | 5/2006 | Strobel | F25B 9/02 250/286 |
| 2006/0288731 A1 | 12/2006 | Atkins et al. | |
| 2007/0245749 A1* | 10/2007 | Atkins | F25B 9/00 62/51.1 |
| 2011/0101982 A1 | 5/2011 | Huang et al. | |
| 2012/0108433 A1 | 5/2012 | Jiang et al. | |
| 2012/0176134 A1 | 7/2012 | Jiang et al. | |
| 2012/0196753 A1 | 8/2012 | Laskaris et al. | |
| 2012/0319690 A1* | 12/2012 | Ma | G01R 33/3403 324/322 |
| 2013/0203603 A1 | 8/2013 | Harrison | |

\* cited by examiner

SYSTEM AND METHOD FOR COOLING A MAGNETIC RESONANCE IMAGING DEVICE

BACKGROUND

Techincal Field

Embodiments of the invention relate generally to magnetic resonance imaging and, more specifically, to a cooling system and method for a magnetic resonance imaging device.

Discussion of Art

Magnetic resonance imagine (MRI) machines work by generating a very strong magnetic field using a superconducting magnet which consists of many coils or windings of wires through which a current is passed. Creating a strong magnetic field is accomplished using superconductivity, which involves reducing the resistance in the current-carrying conductors to practically zero by cooling them to ultra-low temperatures below the superconducting limits This may be achieved by immersing the coils in a bath of liquid cryogen, such as liquid helium, and/or by circulating liquid cryogen within cooling loops adjacent to, or through, the coils, or by providing solid conductive pathways that allow to withdraw heat from the coils.

As will be readily appreciated, maintaining an ultra-low temperature in the coils is necessary for proper operation of the MRI machine. However, during ramp, considerable heat may be generated, mainly in leads, switches and heaters, which is transferred to and deposited in the cold mass assembly. During persistent operation, the heat is introduced either via solid conduction components, such as current leads, penetrations or suspension elements, or by radiation or residual gas conduction coming from components of cryostat assembly with higher temperature. The heat coming to the cold mass that contains the coils may lead to boil-off or evaporation of the cryogen, requiring replenishment.

Considerable research and development efforts have therefore been directed at minimizing the need to replenish the boiling cryogen. This has led to the use of cryogen gas recondensing systems that utilize a mechanical refrigerator or cryocooler, also known as a cold head, to cool the cryogen gas and recondense it back to liquid cryogen for reuse.

However, from time to time the cooling may be interrupted in the MRI devices located in clinical environment. That happens, for example, when it becomes necessary to remove the cryocooler for replacement and/or servicing. It is desirable to accomplish this without discontinuing superconducting operation of the magnet because of the time and expense resulting from relatively long "down-time" and subsequent ramping up period of bringing the magnet back to superconducting operation. Replacement of the cryocooler must therefore be effected in the period after a problem or service need is detected and before superconducting operation ceases.

Another condition when cooling power ceases to be provided to the superconducting magnet is a power outage. During the outage, the non-operating coldhead introduces thermal short that may input additional heat to the superconducting system.

This period after the cooling power is interrupted and before the superconducting operation ceases is known as the ride-through period, during which the final period of superconducting magnet operation and helium boil-off continues before quenching of the superconducting magnet. Indeed, for magnets with closed helium inventory, i.e., low cryogen type magnets, the duration of tolerable power outage, coldhead service or ramp profile is limited by the volume of accumulated liquid helium that boils off or evaporates during the above conditions with extra heat load.

It is therefore desirable to be able to extend the ride-through period to provide sufficient time for detection and correction of a problem such as by replacement of a cryocooler, to withstand a power outage, and also to avoid the possibility of peak temperatures being generated by superconducting operation quench which could exceed the critical temperature of the superconducting wires with which the magnet coils are wound.

BRIEF DESCRIPTION

In an embodiment, a cooling system is provided. The cooling system includes a first cooling loop containing a first cryogen, the first cooling loop being in thermal communication with a superconducting magnet and being configured to provide primary cooling for the magnet and a second cooling loop also containing the first cryogen. The second cooling loop is in thermal communication with an enclosure containing a second cryogen, and is configured to cool the second cryogen within the enclosure. The enclosure, in turn, is in thermal communication with the superconducting magnet and is configured to provide secondary cooling for the magnet.

In an embodiment, an imaging apparatus is provided. The imaging apparatus includes at least one coil support shell or former, a plurality of superconducting magnet coils supported by the at least one coil support former, a first cooling loop containing a first cryogen, the first cooling loop being in thermal communication with the magnet coils and providing primary cooling for the magnet coils, an enclosure defining a thermal battery, the thermal battery containing a second cryogen and being in thermal communication with the magnet coils, a second cooling loop also containing the first cryogen, the second cooling loop being in thermal communication with the thermal battery and configured to cool the second cryogen, and a cryocooler fluidly coupled with the first cooling loop and the second cooling loop forming a closed circulation cooling system. The thermal battery is configured to provide secondary cooling for the magnet coils.

In an embodiment, a cooling system is provided. The cooling system includes a cryogen reservoir containing a closed-supply of a first cryogen, a first cooling loop in fluid communication with the cryogen reservoir and configured to receive the first cryogen from the cryogen reservoir for circulation therethrough, and a thermal battery compartment directly coupled to the cryogen reservoir, the thermal battery compartment containing a second cryogen. The first cooling loop being in thermal communication with a superconducting magnet and is configured to provide primary cooling for the magnet.

In an embodiment, a method of cooling a superconducting magnet is provided. The method includes the steps of circulating a first cryogen through a first cooling loop in thermal communication with the superconducting magnet and circulating the first cryogen through a second cooling loop in thermal communication with an enclosure containing a second cryogen to cool the second cryogen to form a high enthalpy thermal battery.

DRAWINGS

The present invention will be better understood from reading the following description of non-limiting embodiments, with reference to the attached drawings, wherein below:

DETAILED DESCRIPTION

Figure 1:
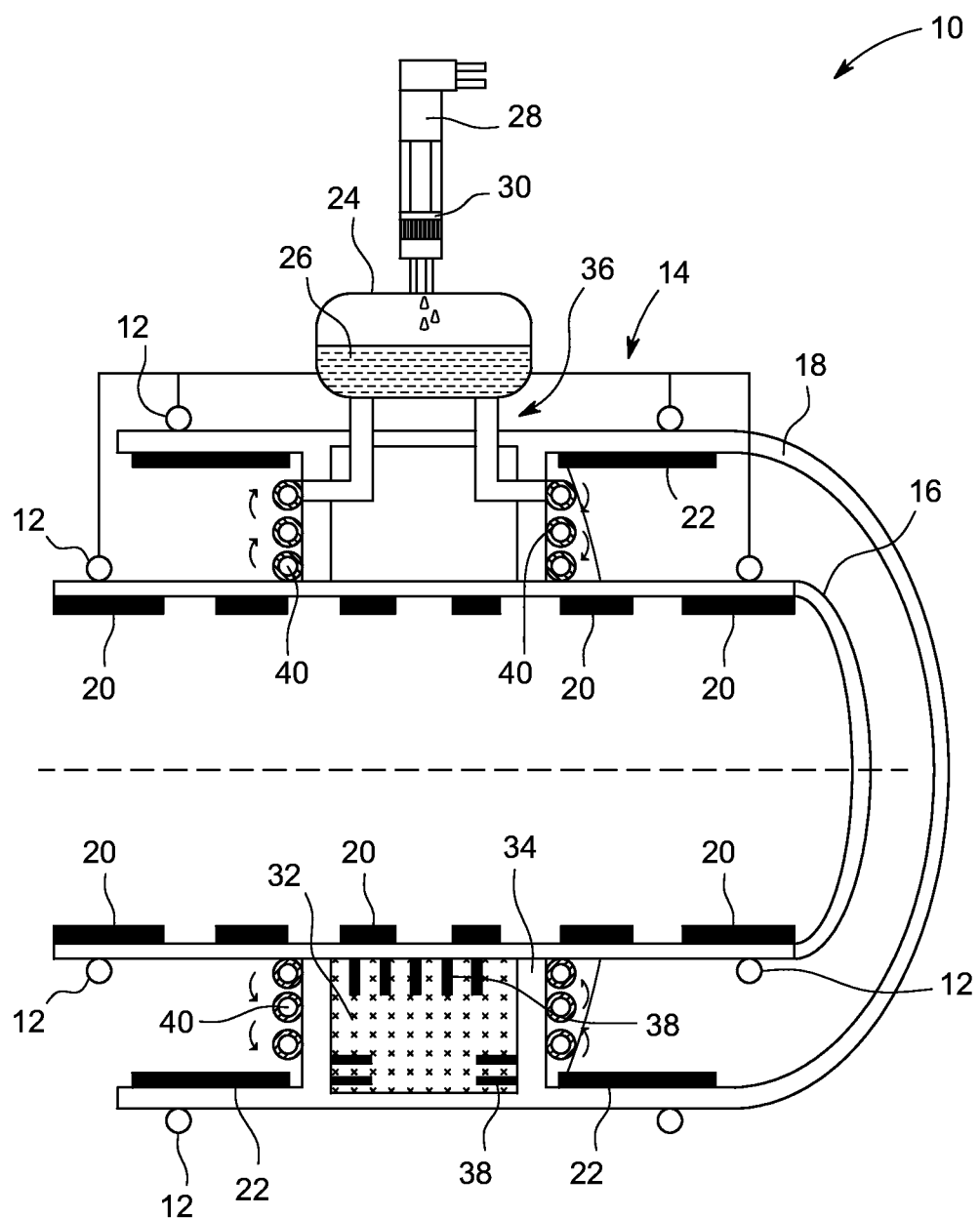
FIG. 1 is side, cross-sectional view of a cooling system for a magnetic resonance imaging machine in accordance with an embodiment of the present invention.

Reference will be made below in detail to exemplary embodiments of the invention, examples of which are illustrated in the accompanying drawings. Wherever possible, the same reference characters used throughout the drawings refer to the same or like parts. Although embodiments of the present invention are described as intended for use with superconducting magnets embodied in MRI machines, the present invention may also be used for the cooling of superconducting magnets, generally, irrespective of their specific end use. As used herein, "thermally interconnected," "thermally connected" and "thermal communication" means that two physical systems or components are associated in such a manner that thermal energy and heat may be transferred between such systems or components. For example, such thermal communication can be achieved, without loss of generality, by snug contact between surfaces at an interface; one or more heat transfer materials or devices between surfaces; a connection between solid surfaces using a thermally conductive material system, or other structures with high thermal conductivity between the surfaces (e.g., heat exchangers); other suitable structures; or combinations of structures. Substantial thermal communication can take place between surfaces that are directly connected (e.g., contact each other) or indirectly connected via one or more interface materials. Thermal communication be conductive, convective, radiative, or any combination thereof. As also used herein, "fluid communication" or "fluidly coupled" is meant to refer to a coupling through a channel or conduit that allows fluids (e.g., gases and liquids) to flow therethrough or therebetween, at least at desired times.

Referring now to FIG. 1, a cooling system 10 for a superconducting magnet of a MRI machine is illustrated. As shown therein, the cooling system 10 includes a plurality of structure cooling tubes 12, or other suitable cooing paths, with liquid helium circulating within the cooling tubes 12. The cooling tubes 12 define a structure cooling loop 14. The cooling tubes 12 are thermally coupled to a main coil former 16 and a shield former or support shell 18 that encompasses the main former 16. The main coil former 16 and shield coil former 18 support or maintain the position of main MRI magnet coils 20 and shield MRI magnet coils 22, respectively, in a manner heretofore known in the art. For example, the main magnet coils 20 may be shrink fit and bonded inside the main former 16, which may be a cylindrical metal coil former, to thereby provide thermal contact therebetween. Likewise the shield magnet coils 22 may be shrink fit and bonded inside the shield former 18, which may be a cylindrical metal coil former, to thereby provide thermal contact therebetween. In an embodiment the main magnet coils 20 and the shield magnet coils 22 may be formed from any material capable of producing a superconducting magnet, such as from Niobium-titanium (NbTi) Niobium-tin ($Nb_3Sn$), magnesium diboride ($MgB_2$), or high-temperature superconductors (HTS).

The coil formers 16, 18, which may be formed from a thermally conductive material (e.g., aluminum, copper etc.), provide a cold mass support structure that maintain the position of or support the magnetic coils 20, 22, respectively. The structure cooling tubes 12, which may be formed from any suitable metal (e.g., copper, stainless steel, aluminum, etc.) are in fluid communication with a cryogen storage tank 24. The cryogen storage reservoir 24 contains the liquid cryogen 26 used in the closed loop cooling system 10 to cool the magnet coils 20, 22. In an embodiment, the cryogen 26 is liquid helium.

As further illustrated in FIG. 1, the system 10 includes a coldhead 28, which in various embodiments is a cryocooler. The coldhead 28 includes a recondenser 30 at a lower end thereof that extends into the cryogen reservoir 24. The recondenser 30 is configured to recondense boiled-off helium gas from the reservoir 24, in a manner heretofore known in the art. In particular, the recondenser 30 allows for transferring boiled-off helium gas from the reservoir 24 to the recondenser 30, which may then transfer back recondensed liquid helium to the reservoir 24.

With further reference to FIG. 1, the system 10 further includes a thermal battery 32 intermediate the main former 16 and shield former 18. In an embodiment, the thermal battery is contained within a compartment or enclosure 34 defined by one or more structural components of the superconductive magnet and/or by radial walls extending between the main former 16 and shield former 18. In an embodiment, the thermal battery 32 is a solid nitrogen thermal battery, although other types of thermal batteries having a large enthalpy may also be utilized without departing from the broader aspects of the present invention. The battery 32 has a plurality of quench relief fins 38 arranged therein, the function of which will be described hereinafter. As will be readily appreciated, the thermal battery 32 functions to decelerate the warm-up of the superconducting magnet, thereby enhancing the ride-through capability thereof. In particular, the thermal battery 32 is configured to provide secondary or auxiliary cooling of the magnet coils 20, 22 by absorbing heat generated by the magnet coils 20, 22. In an embodiment, the thermal battery 32 may be vented to allow for filling with liquid nitrogen during initial cool-down, and to allow liquid nitrogen to evaporate.

In connection with the above, a dedicated thermal battery cooling loop 36 is utilized to directly cool the thermal battery 32. As shown in FIG. 1, the thermal battery cooling loop 36 includes a plurality of thermal battery cooling tubes 40, or other suitable cooing paths, with liquid helium circulating within the cooling tubes 40. The thermal battery cooling tubes 38 may be formed from any suitable metal (e.g., copper, stainless steel, aluminum, etc.) and are, like the structure cooling tubes 12, in fluid communication with the cryogen storage tank 24 and receive a supply of liquid helium therefrom. As illustrated in FIG. 1, the thermal battery cooling tubes 40 run along the exterior of the enclosure 34, and are in thermal communication therewith, such that the liquid helium 26 (or other liquid cryogen) circulating within the tubes 38 is utilized to directly cool, and freeze, the nitrogen within the enclosure 34. The cryogen within the enclosure 34 thus acts as a thermal battery. As used herein, "thermal battery" means a device which serves to hold a piece of equipment at a certain temperature without external refrigeration and despite a relatively elevated ambient temperature.

Figure 2:
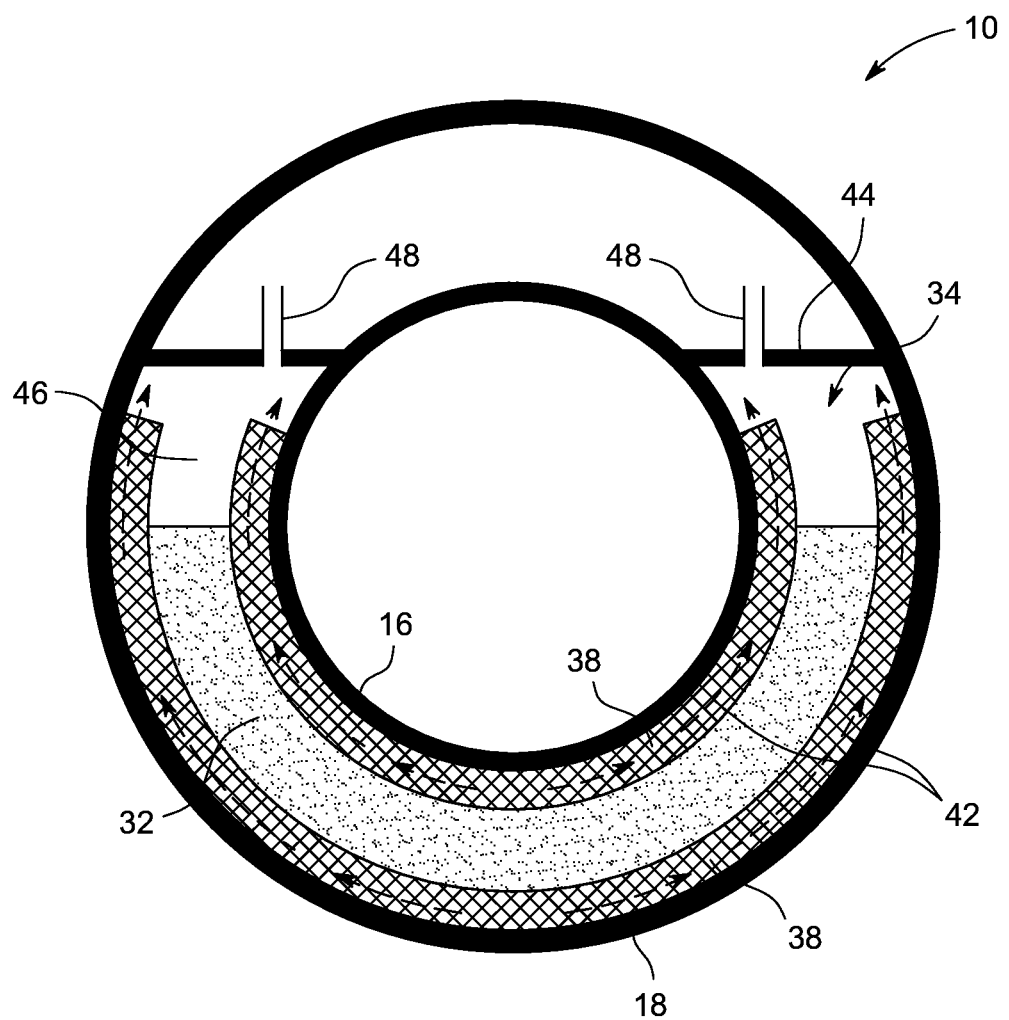
FIG. 2 is a cross-sectional view of a thermal battery of the cooling system of FIG. 1.

Turning now to FIG. 2, a cross-sectional view of the thermal battery compartment 34 is illustrated, showing operation of the quench relief fins 38. As will be readily appreciated, during quench, a high temperature spike in the magnet coils 20, 22 and formers 16, 18 can quickly evaporate the solid nitrogen of the battery 32 in a small, local adjacent area while the bulk of the solid nitrogen is still solid. With the thermal battery 32 of the present invention, however, the quench relief fins 38 heat up first and provide an escape paths 42 for the local gaseous nitrogen to the top 44 of the thermal battery enclosure 34 and minimize the risk of pressure buildup. In particular, as shown therein, upon any spike in temperature in the magnet coils 20, 22 and/or formers 16, 18, the quench relief fins 38 heat up first and provide escape paths 42 for the gaseous nitrogen 46, which is permitted to exit the top 44 of the enclosure 34 through manifolds 48.

As will be readily appreciated, the cooling system 10 is a substantially a hermetically sealed configuration such that a closed-loop cooling system is provided wherein air tight seal prevents (or significantly limits) air or gas from passing therethrough after the liquid cryogen reservoir 24 has been filled with the cooling fluid, for example, liquid helium. For example, the air tight seal prevents oxygen, moisture, humidity, and any/or outside contaminants from entering the sealed closed-loop cooling arrangement, as well as preventing the coolant from being released from the system.

In the illustrated embodiment, venting may be provided, for example, using a vent (not shown). For example, in some embodiments a vent may be configured to provide venting at the highest pressure that the system can handle without failure (or within a predefined range thereof). However, different pressure levels may be provided in embodiments that include the a vent, which may be based on system requirements, regulatory requirements, etc.

As will be readily appreciated therefore, the cooling system 10 of the present invention includes a closed cryogen reservoir 24 having a cooling fluid 26 for circulation through dedicated, parallel cooling loops 14, 36 for cooling the magnet coils 20, 22 and the thermal battery 32, respectively. In this respect, the cooling system 10 of the present invention utilizes a dual cryogen arrangement to cool the magnet coils 20, 22 (i.e., via circulation of a first cryogen through structure cooling loop 14, and via the thermal battery 32 having a second cryogen). As discussed above, the provision of the thermal battery 32 that is cooled by a dedicated cooling loop 36 extends the ride-through period to provide sufficient time for, for example, the detection and correction of a problem such as by replacement of a cryocooler, to withstand a power outage, and also to avoid the possibility of peak temperatures being generated by superconducting operation quench which could exceed the critical temperature of the superconducting wires with which the magnet coils are wound.

In contrast to existing systems, the cooling system 10 of the present invention provides for a closed-cryogen-inventory magnet with improved ride-through times and faster magnet cool-down. The present invention also allows for a quicker and more robust installation, and siting in markets with limited power quality and service capabilities.

Figure 3:
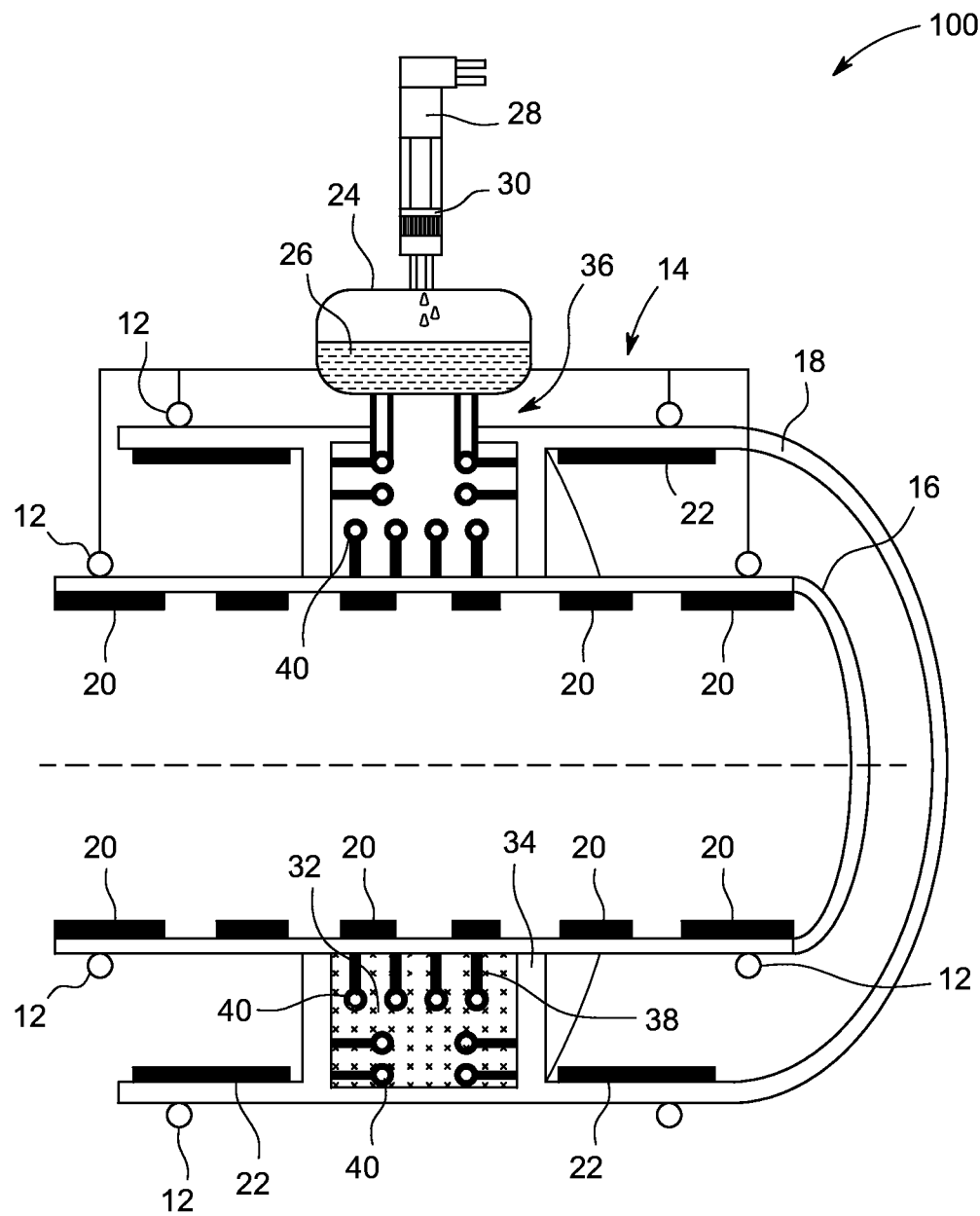
FIG. 3 is side, cross-sectional view of a cooling system for a magnetic resonance imaging machine in accordance with another embodiment of the present invention.

With reference to FIG. 3, a cooling system 100 according to another embodiment of the present invention is illustrated. The cooling system 100 is substantially identical to the cooling system 10 of FIGS. 1 and 2, where like reference numerals designate like parts. As illustrated in FIG. 3, however, the cooling tubes 40 of the thermal battery cooling loop 36 of cooling system 100 run through the thermal battery 32, such that the solidified thermal battery material (e.g., solid nitrogen), is cooled directly by cooling tubes 40, rather than through indirect cooling via heat transfer through the walls of the enclosure 34.

Figure 4:
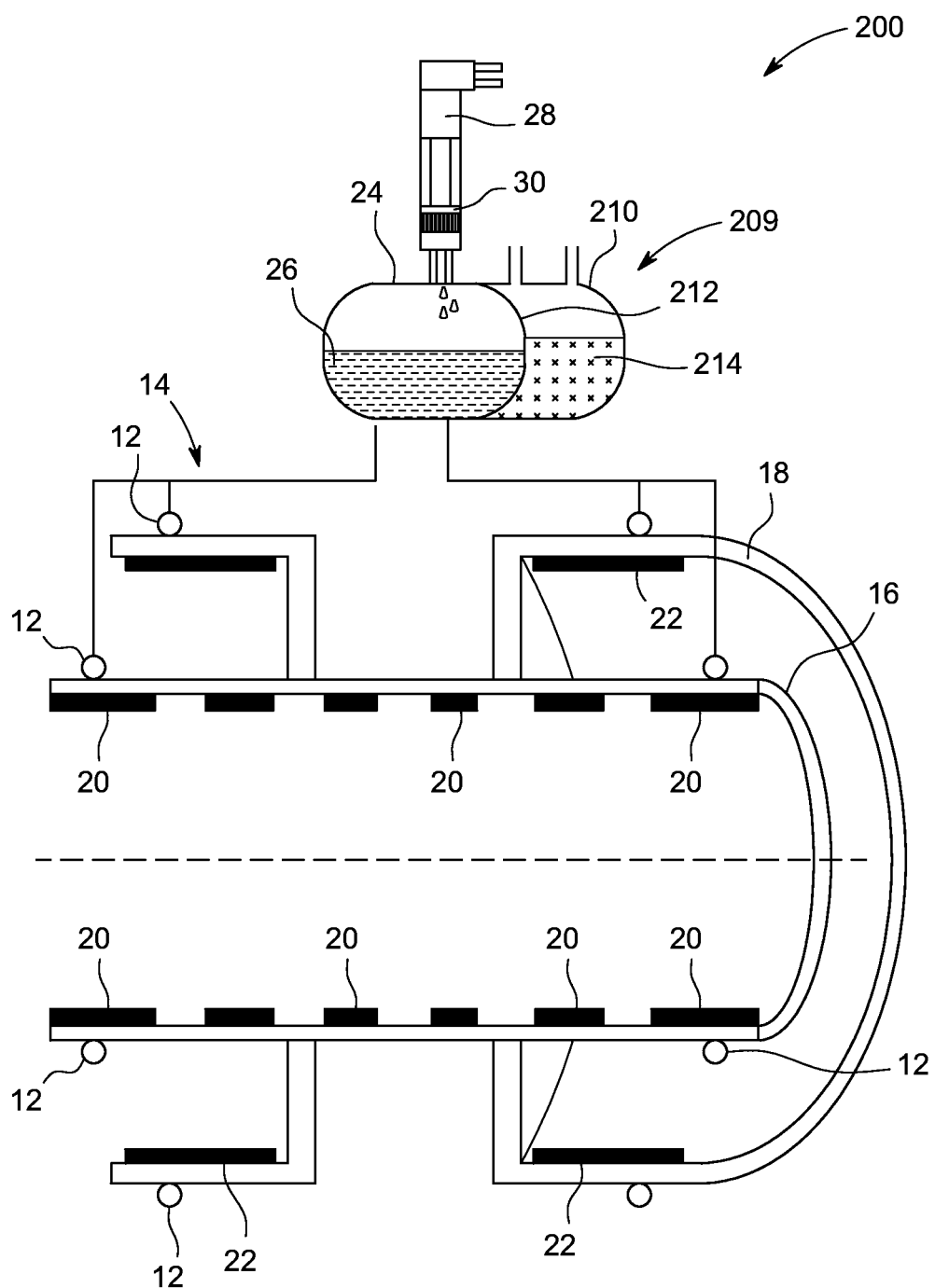
FIG. 4 is side, cross-sectional view of a cooling system for a magnetic resonance imaging machine in accordance with yet another embodiment of the present invention.

Turning now to FIG. 4, a cooling system 200 according to yet another embodiment of the present invention is illustrated. The cooling system 200 is similar to the cooling system 10 of FIGS. 1 and 2 and the cooling system 100 of FIG. 3, where like reference numerals designate like parts. As will be readily appreciated, however, rather than having a dedicated cooling loop for cooling a thermal battery, the system 200 includes a thermal battery 209 within an enclosure 210 in direct contact with the cryogen reservoir 24 via a heat exchange plate 212. In an embodiment, the reservoir 24 and the enclosure 210 may be a single enclosure divided into two compartments by heat exchange plate 212. As illustrated in FIG. 4, the enclosure 210 may be filled with liquid nitrogen 214, which may be frozen to produce a solid nitrogen thermal battery. While FIG. 4 illustrates the use of nitrogen as thermal battery material, other materials having a large enthalpy in solidified form may also be utilized without departing from the broader aspects of the present invention.

The thermal battery, being in direct thermal communication with the cryogen reservoir 24, and after being filled with liquid nitrogen, accelerates the cooldown through the liquid helium convection loops 14, and subsequently turns into solid nitrogen serving as a high enthalpy thermal battery. As will be readily appreciated, because the thermal battery in this embodiment is remote from the coils 20, 22 and the formers 16, 18, it does not see rapid temperature excursion during quench and, therefore, does not require quench relief fins.

As discussed above, the present invention therefore provides a dual-cryogen cooling system for a superconductive magnet whereby the use of a second cryogen accelerates cooldown of the magnet and, upon freezing, serves as a high enthalpy thermal battery that effectively extends the ride-through period of the magnet.

In operation, liquid nitrogen in first introduced into the thermal battery 32. At that time, the helium in the first and second loops is in its gaseous state. The liquid nitrogen helps to speed up the cooldown to approximately 80 K. The first and second closed loops with helium, at the same time, continue to be cooled down by the coldhead, and gaseous helium is circulating through the loops pipes. This freezes the liquid nitrogen to produce a solid nitrogen thermal battery, as discussed above.

In an embodiment, A cooling system includes a first cooling loop containing a first cryogen, the first cooling loop being in thermal communication with a superconducting magnet and being configured to provide primary cooling for the magnet and a second cooling loop also containing the first cryogen. The second cooling loop is in thermal communication with an enclosure containing a second cryogen and is configured to cool the second cryogen within the enclosure. The enclosure is in thermal communication with the superconducting magnet and is configured to provide secondary cooling for the magnet. In an embodiment, the first cryogen is liquid helium and the second cryogen is one solid nitrogen or a mixture of solid nitrogen and liquid nitrogen. In an embodiment, the second cooling loop passes through the enclosure. In an embodiment, the second cooling loop includes cooling tubes which are in contact with an outer surface of the enclosure. In an embodiment, the enclosure is formed by at least one structural component of the superconductive magnet. In an embodiment, the enclosure includes a plurality of quench relief fins that provide an escape path from the enclosure for gaseous nitrogen. In an embodiment, the system also includes a cryogen reservoir in fluid communication with the first cooling loop and the second cooling loop which includes a closed-supply of the liquid helium for circulation through the first cooling loop and the second cooling loop. In an embodiment, the system may also include a cryocooler having a recondenser in fluid communication with the cryogen reservoir. In an embodiment, the superconducting magnet, first cooling loop, second cooling loop, enclosure, cryogen reservoir and cryocooler form a part of a magnetic resonance imaging machine.

In an embodiment, an imaging apparatus is provided. The imaging apparatus includes at least one coil support former, a plurality of superconducting magnet coils supported by the at least one coil support former, a first cooling loop containing a first cryogen, the first cooling loop being in thermal communication with the magnet coils and providing primary cooling for the magnet coils, an enclosure defining a thermal battery, the thermal battery containing a second cryogen and being in thermal communication with the magnet coils, a second cooling loop also containing the first cryogen, the second cooling loop being in thermal communication with the thermal battery and configured to cool the second cryogen, and a cryocooler fluidly coupled with the first cooling loop and the second cooling loop forming a closed circulation cooling system. The thermal battery is configured to provide secondary cooling for the magnet coils. In an embodiment, the first cryogen is liquid helium and the second cryogen is one solid nitrogen or a mixture of solid nitrogen and liquid nitrogen. In an embodiment, the second cooling loop passes through the thermal battery. In an embodiment, the second cooling loop includes cooling tubes which are in contact with an outer surface of the enclosure. In an embodiment, the enclosure is formed by at least one structural component of magnet coils. In an embodiment, the enclosure includes a plurality of quench relief fins that provide an escape path for gaseous nitrogen from the enclosure. In an embodiment, the imaging apparatus is a magnetic resonance imaging machine.

In an embodiment, a cooling system is provided. The cooling system includes a cryogen reservoir containing a closed-supply of a first cryogen, a first cooling loop in fluid communication with the cryogen reservoir and configured to receive the first cryogen from the cryogen reservoir for circulation therethrough, and a thermal battery compartment directly coupled to the cryogen reservoir, the thermal battery compartment containing a second cryogen. The first cooling loop being in thermal communication with a superconducting magnet and is configured to provide primary cooling for the magnet. In an embodiment, the cryogen reservoir and the thermal battery compartment are separated by a heat exchange plate. In an embodiment, the first cryogen is liquid helium and the second cryogen is liquid nitrogen. In an embodiment, the liquid nitrogen within the thermal battery compartment is configured to accelerate cooldown of the magnet through the first cooling loop and to function as an enthalpy battery when the liquid nitrogen is frozen to produce solid nitrogen.

In an embodiment, a method of cooling a superconducting magnet is provided. The method includes the steps of circulating a first cryogen through a first cooling loop in thermal communication with the superconducting magnet and circulating the first cryogen through a second cooling loop in thermal communication with an enclosure containing a second cryogen to cool the second cryogen to form a high enthalpy thermal battery. In an embodiment, the thermal battery is configured to provide secondary cooling for the superconducting magnet during a ride-through period though at least one of convection and conduction. In an embodiment, the enclosure is formed by at least one structural component of the superconductive magnet. In an embodiment, the first cryogen is liquid helium and the second cryogen is liquid nitrogen. The method may also include the step of precooling the magnet by filling a thermal battery reservoir defining the thermal battery with the second cryogen.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope.

While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A cooling system, comprising:
a first cooling loop containing a first cryogen, the first cooling loop being in thermal communication with a superconducting magnet and being configured to provide primary cooling for the magnet; and
a second cooling loop also containing the first cryogen, the second cooling loop being in thermal communication with an enclosure containing a second cryogen, the second cooling loop being configured to cool the second cryogen within the enclosure;
wherein the enclosure is in thermal communication with the superconducting magnet and is configured to provide secondary cooling for the magnet.

2. The cooling system of claim 1, wherein:
the first cryogen is liquid helium; and
the second cryogen is one solid nitrogen or a mixture of solid nitrogen and liquid nitrogen.

3. The cooling system of claim 2, wherein:
the second cooling loop passes through the enclosure.

4. The cooling system of claim 2, wherein:
the second cooling loop includes cooling tubes which are in contact with an outer surface of the enclosure.

5. The cooling system of claim 2, wherein:
the enclosure is formed by at least one structural component of the superconductive magnet.

6. The cooling system of claim 2, wherein:
the enclosure includes a plurality of quench relief fins that provide an escape path from the enclosure for gaseous nitrogen.

7. The cooling system of claim 2, further comprising:
a cryogen reservoir in fluid communication with the first cooling loop and the second cooling loop, the cryogen reservoir including a closed-supply of the liquid helium for circulation through the first cooling loop and the second cooling loop.

8. The cooling system of claim 7, further comprising:
a cryocooler having a recondenser in fluid communication with the cryogen reservoir.

9. The cooling system of claim 8, wherein:
the superconducting magnet, first cooling loop, second cooling loop, enclosure, cryogen reservoir and cryocooler form a part of a magnetic resonance imaging machine.

10. An imaging apparatus, comprising:
at least one coil support shell;
a plurality of superconducting magnet coils supported by the at least one coil support shell;
a first cooling loop containing a first cryogen, the first cooling loop being in thermal communication with the magnet coils and providing primary cooling for the magnet coils;
an enclosure defining a thermal battery, the thermal battery containing a second cryogen and being in thermal communication with the magnet coils;
a second cooling loop also containing the first cryogen, the second cooling loop being in thermal communication with the thermal battery and configured to cool the second cryogen; and
a cryocooler fluidly coupled with the first cooling loop and the second cooling loop forming a closed circulation cooling system;
wherein the thermal battery is configured to provide secondary cooling for the magnet coils.

11. The imaging apparatus of claim 10, wherein:
the first cryogen is liquid helium; and
the second cryogen is one solid nitrogen or a mixture of solid nitrogen and liquid nitrogen.

12. The imaging apparatus of claim 11, wherein:
the second cooling loop passes through the thermal battery.

13. The imaging apparatus of claim 11, wherein:
the second cooling loop includes cooling tubes which are in contact with an outer surface of the enclosure.

14. The imaging apparatus of claim 11, wherein:
the enclosure is formed by at least one structural component of magnet coils.

15. The imaging apparatus of claim 11, wherein:
the enclosure includes a plurality of quench relief fins that provide an escape path for gaseous nitrogen from the enclosure.

16. The imaging apparatus of claim 11, wherein:
the imaging apparatus is a magnetic resonance imaging machine.

17. A cooling system, comprising:
a cryogen reservoir containing a closed-supply of a first cryogen;
a first cooling loop in fluid communication with the cryogen reservoir and configured to receive the first cryogen from the cryogen reservoir for circulation therethrough, the first cooling loop being in thermal communication with a superconducting magnet and being configured to provide primary cooling for the magnet; and
a thermal battery compartment directly coupled to the cryogen reservoir, the thermal battery compartment containing a second cryogen.

18. The cooling system of claim 17, wherein:
the cryogen reservoir and the thermal battery compartment are separated by a heat exchange plate.

19. The cooling system of claim 18, wherein:
the first cryogen is liquid helium; and
the second cryogen is liquid nitrogen.

20. The cooling system of claim 19, wherein:
the liquid nitrogen within the thermal battery compartment is configured to accelerate cooldown of the magnet through the first cooling loop and to function as an enthalpy battery when the liquid nitrogen is frozen to produce solid nitrogen.

21. A method of cooling a superconducting magnet, the method comprising the steps of:
circulating a first cryogen through a first cooling loop in thermal communication with the superconducting magnet; and
circulating the first cryogen through a second cooling loop in thermal communication with an enclosure containing a second cryogen to cool the second cryogen to form a high enthalpy thermal battery.

22. The method according to claim 21, wherein:
the thermal battery is configured to provide secondary cooling for the superconducting magnet during a ride-through period though at least one of convection and conduction.

23. The method according to claim 22, wherein:
the enclosure is formed by at least one structural component of the superconductive magnet.

24. The method according to claim 22, wherein:
the first cryogen is liquid helium; and
the second cryogen is liquid nitrogen.

25. The method according to claim 21, further comprising the step of:

precooling the magnet by filling a thermal battery reservoir defining the thermal battery with the second cryogen.

\* \* \* \* \*